(12) United States Patent
Nakayama et al.

(10) Patent No.: US 11,125,895 B2
(45) Date of Patent: Sep. 21, 2021

(54) DETECTION ELEMENT AND DETECTOR

(71) Applicant: Kabushiki Kaisha Toshiba, Minato-ku (JP)

(72) Inventors: Kohei Nakayama, Kawasaki (JP); Fumihiko Aiga, Kawasaki (JP); Go Kawata, Nagareyama (JP); Isao Takasu, Setagaya (JP); Yuko Nomura, Kawasaki (JP); Satomi Taguchi, Ota (JP); Hyangmi Jung, Yokohama (JP); Atsushi Wada, Kawasaki (JP); Rei Hasegawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 35 days.

(21) Appl. No.: 16/123,332

(22) Filed: Sep. 6, 2018

(65) Prior Publication Data
US 2019/0285759 A1 Sep. 19, 2019

(30) Foreign Application Priority Data
Mar. 14, 2018 (JP) .............................. JP2018-046594

(51) Int. Cl.
*G01T 1/24* (2006.01)
*H01L 27/30* (2006.01)
*H01L 51/44* (2006.01)
*H01L 51/42* (2006.01)

(52) U.S. Cl.
CPC ............ *G01T 1/241* (2013.01); *H01L 27/301* (2013.01); *H01L 51/444* (2013.01); *G01T 1/242* (2013.01); *H01L 51/4206* (2013.01)

(58) Field of Classification Search
CPC ............ G01T 1/24; H01L 27/30; H01L 51/44
See application file for complete search history.

(56) References Cited

U.S. PATENT DOCUMENTS

| 5,025,162 | A | * | 6/1991 | Charpak | ............... G01T 1/2935 250/385.1 |
| 5,117,114 | A | * | 5/1992 | Street | ............... H01L 31/02327 250/370.11 |
| 5,223,717 | A | * | 6/1993 | Charpak | ................. G01T 1/205 250/374 |
| 5,311,010 | A | * | 5/1994 | Kruger | .................. H01J 29/385 250/214 VT |
| 5,321,269 | A | * | 6/1994 | Kitaguchi | ................. G01T 3/08 250/252.1 |

(Continued)

FOREIGN PATENT DOCUMENTS

| JP | H01-126583 A | 5/1989 |
| JP | 2004-186604 | 7/2004 |

(Continued)

*Primary Examiner* — David P Porta
*Assistant Examiner* — Djura Malevic
(74) *Attorney, Agent, or Firm* — Oblon, McClelland, Maier & Neustadt, L.L.P.

(57) ABSTRACT

According to an embodiment, a detection element includes a first electrode, a second electrode, an organic conversion layer, and a third electrode. The organic conversion layer is provided between the first electrode and the second electrode, and is configured to convert energy of a radiant ray into a charge. The third electrode is provided inside the organic conversion layer. Bias is applied to the third electrode.

17 Claims, 4 Drawing Sheets

(56) References Cited

U.S. PATENT DOCUMENTS

| | | | | |
|---|---|---|---|---|
| 5,587,621 A * | 12/1996 | Colditz | H01J 29/385 | 313/366 |
| 5,627,377 A * | 5/1997 | Hamilton, Jr. | H01L 25/043 | 250/370.01 |
| 5,905,264 A * | 5/1999 | Shahar | H01L 27/14601 | 250/370.01 |
| 6,069,360 A * | 5/2000 | Lund | H01L 31/0296 | 250/370.01 |
| 6,175,120 B1 * | 1/2001 | McGregor | G01T 1/24 | 250/370.06 |
| 6,194,714 B1 * | 2/2001 | Maitrejean | G01T 1/2935 | 250/252.1 |
| 6,350,989 B1 * | 2/2002 | Lee | H01L 27/1446 | 250/370.01 |
| 6,592,969 B1 * | 7/2003 | Burroughes | H01L 51/5012 | 428/195.1 |
| 6,812,469 B2 * | 11/2004 | Katagiri | G01T 3/06 | 250/361 R |
| 6,864,111 B2 * | 3/2005 | Yu | H01L 27/308 | 438/22 |
| 7,541,605 B2 * | 6/2009 | Takahashi | B82Y 10/00 | 250/580 |
| 7,855,372 B2 * | 12/2010 | McGregor | G01T 3/08 | 250/390.01 |
| 8,129,688 B2 * | 3/2012 | Karim | G01T 1/241 | 250/370.01 |
| 8,513,616 B2 * | 8/2013 | Desaute | H01J 47/06 | 250/385.1 |
| 8,975,593 B1 * | 3/2015 | Best | G01T 3/008 | 250/391 |
| 9,217,793 B2 * | 12/2015 | Zhou | G01T 3/008 | |
| 9,268,032 B2 * | 2/2016 | Yang | G01T 1/241 | |
| 9,590,128 B2 * | 3/2017 | Cauffiel | G01T 3/08 | |
| 9,851,454 B2 * | 12/2017 | Cao | G01T 1/20 | |
| 9,968,327 B2 * | 5/2018 | Chen | A61B 6/4208 | |
| 9,995,831 B2 * | 6/2018 | Verschuren | G01T 1/2002 | |
| 2003/0127973 A1 * | 7/2003 | Weaver | H01L 51/5268 | 313/504 |
| 2004/0021088 A1 * | 2/2004 | Thers | H01J 47/02 | 250/385.1 |
| 2004/0252867 A1 * | 12/2004 | Lan | G06K 9/0004 | 382/124 |
| 2005/0023472 A1 * | 2/2005 | Wei | G01T 1/2002 | 250/368 |
| 2005/0205903 A1 * | 9/2005 | Hioki | H01L 27/14647 | 257/291 |
| 2005/0224905 A1 * | 10/2005 | Forrest | H01L 51/4253 | 257/461 |
| 2005/0258372 A1 * | 11/2005 | McGregor | G01T 1/185 | 250/390.01 |
| 2006/0008745 A1 * | 1/2006 | Sasaki | G03C 5/58 | 430/322 |
| 2006/0033031 A1 * | 2/2006 | Takeda | G01T 1/2018 | 250/370.11 |
| 2006/0105492 A1 * | 5/2006 | Veres | B82Y 10/00 | 438/99 |
| 2006/0201181 A1 * | 9/2006 | Bauer | F21V 33/0044 | 62/264 |
| 2006/0220509 A1 * | 10/2006 | Ghosh | B82Y 20/00 | 313/110 |
| 2007/0097042 A1 * | 5/2007 | Bauer | F25D 29/00 | 345/82 |
| 2007/0131867 A1 * | 6/2007 | Okada | G01T 1/2018 | 250/370.09 |
| 2007/0152213 A1 * | 7/2007 | Weaver | H01L 25/047 | 257/40 |
| 2007/0176131 A1 * | 8/2007 | Takahashi | G01T 1/20 | 250/581 |
| 2007/0235727 A1 * | 10/2007 | Setayesh | H01L 51/0026 | 257/40 |
| 2007/0298169 A1 * | 12/2007 | Kim | H01L 51/5246 | 427/282 |
| 2008/0116815 A1 * | 5/2008 | Foust | H01L 27/3204 | 315/185 R |
| 2008/0290280 A1 * | 11/2008 | Ruetten | G01T 1/2002 | 250/361 R |
| 2009/0221207 A1 * | 9/2009 | Russell | C03C 27/06 | 445/25 |
| 2009/0256140 A1 * | 10/2009 | Meng | G01N 21/6428 | 257/40 |
| 2009/0283685 A1 * | 11/2009 | Takeda | A61B 6/4233 | 250/370.11 |
| 2010/0128845 A1 * | 5/2010 | Yamamoto | H01L 27/14676 | 378/62 |
| 2010/0213380 A1 * | 8/2010 | Kub | G01T 3/08 | 250/370.05 |
| 2010/0265078 A1 * | 10/2010 | Friedman | G01T 1/2935 | 340/600 |
| 2010/0327169 A1 * | 12/2010 | Korn | G01T 1/2018 | 250/363.01 |
| 2011/0017913 A1 * | 1/2011 | Kasai | C09K 11/628 | 250/361 R |
| 2011/0037382 A1 * | 2/2011 | Choi | H01L 51/524 | 313/504 |
| 2011/0095193 A1 * | 4/2011 | Orava | G01T 3/08 | 250/370.05 |
| 2011/0124136 A1 * | 5/2011 | Hirayama | C09J 5/06 | 438/34 |
| 2011/0203649 A1 * | 8/2011 | Konemann | H01L 51/4246 | 136/255 |
| 2012/0025090 A1 * | 2/2012 | Diawara | G01T 3/00 | 250/390.11 |
| 2012/0049054 A1 * | 3/2012 | Zhou | B82Y 15/00 | 250/265 |
| 2012/0049254 A1 * | 3/2012 | Itonaga | H01L 27/14636 | 257/291 |
| 2012/0098421 A1 * | 4/2012 | Thompson | B32B 27/08 | 313/512 |
| 2012/0146489 A1 * | 6/2012 | Fischer | B32B 17/10073 | 313/504 |
| 2012/0286651 A1 * | 11/2012 | Levermore | H05B 33/10 | 313/504 |
| 2012/0313196 A1 * | 12/2012 | Li | H01L 27/1446 | 257/429 |
| 2014/0225094 A1 * | 8/2014 | Fraboni | H01L 51/0003 | 257/40 |
| 2015/0060676 A1 * | 3/2015 | Couture | G01T 1/2018 | 250/366 |
| 2015/0221706 A1 * | 8/2015 | Udaka | H01L 27/322 | 257/40 |
| 2016/0006962 A1 * | 1/2016 | Kimura | H04N 5/3692 | 348/307 |
| 2016/0247860 A1 * | 8/2016 | Ito | H01L 51/4253 | |
| 2017/0115405 A1 * | 4/2017 | Biele | G01T 1/24 | |
| 2017/0125625 A1 * | 5/2017 | Cauffiel | H01L 31/02161 | |
| 2017/0170412 A1 * | 6/2017 | Kanitz | H01L 51/424 | |
| 2017/0308212 A1 * | 10/2017 | Jin | G06F 3/0412 | |
| 2018/0024673 A1 * | 1/2018 | Han | H05K 1/0296 | 345/174 |
| 2018/0102491 A1 * | 4/2018 | Hou | H01L 51/4206 | |
| 2019/0265370 A1 * | 8/2019 | Nakayama | G01T 1/241 | |
| 2020/0091452 A1 * | 3/2020 | Nakayama | H01L 51/441 | |

FOREIGN PATENT DOCUMENTS

| | | |
|---|---|---|
| JP | 2009-032983 A | 2/2009 |
| JP | 2012-15434 | 1/2012 |
| JP | 2013-89685 | 5/2013 |
| JP | 2014-529728 | 11/2014 |
| KR | 10-2017-0029363 A | 3/2017 |

* cited by examiner

DETECTION ELEMENT AND DETECTOR

CROSS-REFERENCE TO RELATED APPLICATIONS

This application is based upon and claims the benefit of priority from Japanese Patent Application No. 2018-046594, filed on Mar. 14, 2018; the entire contents of which are incorporated herein by reference.

FIELD

Embodiments described herein relate generally to a detection element and a detector.

BACKGROUND

There is known a detection element that uses an organic conversion layer of organic material as a semiconductor layer that converts radiant rays into charges. The detection element detects an output signal corresponding to an electron-hole pair generated by a radiant ray that has entered the organic conversion layer, and thereby detects the radiant ray. In such a detection element, there is known a configuration of thickening a thickness of an organic semiconductor layer for improving detection sensitivity of radiant rays other than gamma rays.

Nevertheless, as the thickness of the organic conversion layer becomes thicker, it becomes necessary to apply high voltage to the organic semiconductor layer, to form a larger electrical field. As a result, a difference in potential between an earth provided outside the detection element, and an electrode to which high voltage has been applied becomes large, and a change in electromagnetic energy stored between the electrode and the earth is sometimes detected as noises. Thus, in the conventional techniques, detection sensitivity decreases in some cases.

DETAILED DESCRIPTION

According to an embodiment, a detection element includes a first electrode, a second electrode, an organic conversion layer, and a third electrode. The organic conversion layer is provided between the first electrode and the second electrode, and is configured to convert energy of a radiant ray into a charge. The third electrode is provided inside the organic conversion layer. Bias is applied to the third electrode.

The details of the present embodiment will be described below with reference to the appended drawings.

First Embodiment

Figure 1:
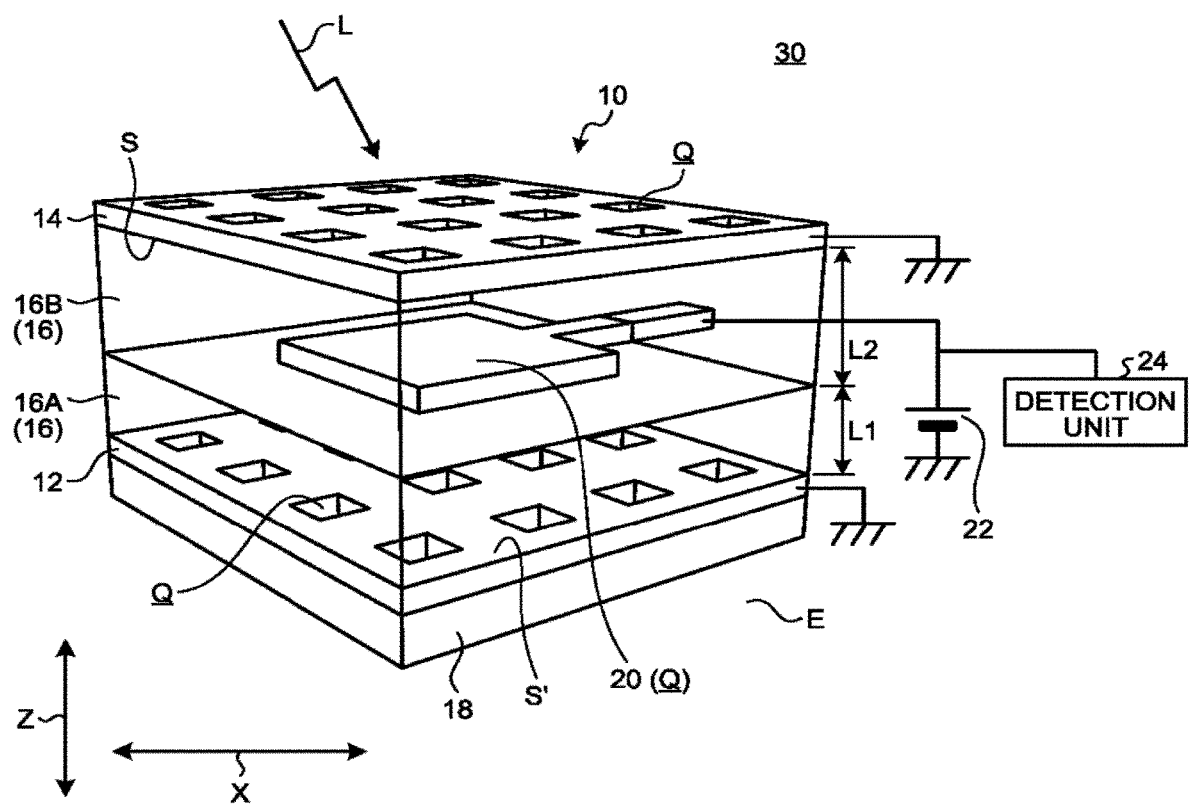
FIG. 1 is a schematic diagram illustrating an example of a detector.

FIG. 1 is a schematic diagram illustrating an example of a detector 30 of the present embodiment.

The detector 30 includes a detection element 10, a voltage applying unit 22, and a detection unit 24. The detection element 10, the voltage applying unit 22, and the detection unit 24 are electrically connected.

First of all, the detection element 10 will be described. The detection element 10 includes a substrate 18, a first electrode 12, a second electrode 14, an organic conversion layer 16, and a third electrode 20.

In the present embodiment, the detection element 10 is a layer stack body in which the first electrode 12, the organic conversion layer 16, and the second electrode 14 are stacked on the substrate 18 in this order. In other words, the organic conversion layer 16 is disposed between the first electrode 12 and the second electrode 14. The third electrode 20 is disposed inside the organic conversion layer 16 (details will be described later).

The substrate 18 is only required to be a member that can support components in the detection element 10 that are other than the substrate 18. The substrate 18 is a glass substrate, for example, but the substrate 18 is not limited to this.

The first electrode 12 is disposed between the organic conversion layer 16 and the substrate 18. In the present embodiment, the first electrode 12 is grounded.

In the present embodiment, the first electrode 12 is disposed on a downstream side in an incident direction of a radiant ray L with respect to the organic conversion layer 16. In the present embodiment, the first electrode 12 is disposed on the downstream side of the organic conversion layer 16 in the incident direction of the radiant ray L, with being in contact with the organic conversion layer 16. In the present embodiment, the radiant ray L enters from the second electrode 14 side in the detection element 10 in a direction heading for the first electrode 12 side. In addition, a layer (e.g. adhesion layer) that does not affect an electrical field generated between the first electrode 12 and the second electrode 14 may be disposed between the first electrode 12 and the organic conversion layer 16.

The first electrode 12 is a sheet-like electrode extending along an incidence surface S of the radiant ray L in the organic conversion layer 16, for example. A direction extending along the incidence surface S matches a direction (arrow X direction) orthogonal to a thickness direction (arrow Z direction) of the organic conversion layer 16.

In addition, hereinafter, the thickness direction (arrow Z direction) will be sometimes described with being referred to as a thickness direction 2. In addition, hereinafter, the direction (arrow X direction) orthogonal to the thickness direction Z will be sometimes described with being referred to as a plane direction X.

A position and a range of the first electrode 12 in the plane direction X of the organic conversion layer 16 are not limited. The first electrode 12 preferably has a sheet shape disposed throughout the entire region of a surface of the organic conversion layer 16 that is provided on an exit surface S' side. An exit surface S' of the organic conversion layer 16 indicates an end surface of the organic conversion layer 16 that is provided on a side from which the radiant ray L to be measured exits. In addition, the first electrode 12 may have a sheet shape that occupies a partial region of the surface of the organic conversion layer 16 that is provided on the exit surface S' side. In addition, the first electrode 12 may have a configuration including a plurality of regions having the same position in the thickness direction Z of the organic conversion layer 16, and having different positions on the surface of the organic conversion layer 16 that is provided on the exit surface S' side.

In addition, the first electrode 1 may have a configuration having one or a plurality of through-holes that penetrate in the thickness direction Z.

The second electrode 14 is disposed on an upstream side in the incident direction of the radiant ray L with respect to the organic conversion layer 16. In the present embodiment, the second electrode 14 is grounded.

In the present embodiment, the second electrode 14 is disposed on the upstream side of the organic conversion layer 16 in the incident direction of the radiant ray L, with being in contact with the organic conversion layer 16. In addition, a layer (e.g. adhesion layer) that does not affect an electrical field generated between the first electrode 12 and the second electrode 14, and does not interfere the transmission of the radiant ray L to be detected may be disposed between the second electrode 14 and the organic conversion layer 16.

A position and a range of the second electrode 14 in the plane direction X of the organic conversion layer 16 are not limited. The second electrode 14 preferably has a sheet shape disposed throughout the entire region of a surface of the organic conversion layer 16 that is provided on the incidence surface S side of the radiant ray L. The incidence surface S of the organic conversion layer 16 indicates an end surface of the organic conversion layer 16 that is provided on a side from which the radiant ray L to be measured enters. In addition, the second electrode 14 may have a sheet shape that occupies a partial region of the surface of the organic conversion layer 16 that is provided on the incidence surface S side. In addition, the second electrode 14 may have a configuration including a plurality of regions having the same position in the thickness direction Z of the organic conversion layer 16, and having different positions on the surface of the organic conversion layer 16 that is provided on the incidence surface S side.

In addition, the second electrode 14 may have a configuration having one or a plurality of through-holes Q that penetrate in the thickness direction Z.

The organic conversion layer 16 is an organic semiconductor layer that converts energy of the radiant ray L into charges. The organic conversion layer 16 is disposed between the first electrode 12 and the second electrode 14. In other words, the first electrode 12 and the second electrode 14 are disposed so as to sandwich the organic conversion layer 16 in the thickness direction Z of the organic conversion layer 16.

The type of the radiant ray L converted by the organic conversion layer 16 into charges is at least one type of a β ray, a heavy particle ray, an α ray, a neutron ray, and a γ ray, for example. In the present embodiment, the organic conversion layer 16 preferably has a configuration of converting energy of at least one type of the β ray, the α ray, and the neutron ray, into charges, and in particular, preferably has a configuration of converting energy of at least the β ray into charges. In other words, the radiant ray L to be detected in the detection element 10 of the present embodiment is preferably the β ray.

The organic conversion layer 16 is only required to have a material constitution including, as a main component, organic material used in a known organic semiconductor. Including as a main component indicates that a content percentage is 70% or more.

For example, organic material used in the organic conversion layer 16 is selected from at least one type of polyphenylene vinylene (PPV) derivative and polythiophene high-polymer material.

The polyphenylene vinylene derivative is poly [2-methoxy, 5-(2'-ethyl-hexyloxy)-p-phenylene-vinylene] (MEH-PPV), for example. The polythiophene high-polymer material is poly (3-alkylthiophene) such as poly-3-hexylthiophene (P3HT), or dioctylfluorene-bithiophene copolymer (F8T2), for example. In particular, P3HT or F8T2 can be preferably used as the organic conversion layer 16.

In addition, the organic conversion layer 16 may be mixture of organic material and inorganic material. In this case, for example, the organic conversion layer 16 may be mixture of the above-described organic material and fullerene, fullerene derivative, a carbon nanotube (CNT) having semiconductivity, a CNT compound, or the like.

The fullerene derivative is [6,6]-phenyl-C61-methyl butyrate (PCBM), dimer of fullerene, a fullerene compound to which alkali metal, alkali earth metal, or the like is introduced, or the like, for example. The CNT is a carbon nanotube containing fullerene or endohedral metallofullerene, for example. In addition, the CNT is a CNT compound obtained by adding various molecules to a side wall or a leading end of the CNT, for example.

The thickness of the organic conversion layer 16 is not limited. In addition, the thickness direction (arrow Z direction) of the organic conversion layer 16 matches a direction (facing direction) in which the first electrode 12 and the second electrode 14 face each other.

Here, it is preferable that the detection element 10 of the present embodiment suppresses the detection of the γ ray, and detects the radiant ray L other than the γ ray (β ray, α ray, neutron ray, etc.). Thus, the thickness of the organic conversion layer 16 is preferably a sufficient thickness that can selectively let through the γ ray, and selectively convert energy of the radiant ray L other than the γ ray (e.g. β ray, α ray, neutron ray, etc.) into charges.

The sufficient thickness preferably indicates a thickness equal to or larger than a thousandfold of the thickness of the first electrode 12 or the second electrode 14. Specifically, as the sufficient thickness, it is preferable that the thickness of the organic conversion layer 16 indicates 50 μm or more, and it is further preferable that the thickness of the organic conversion layer 16 indicates 300 μm or more By setting the thickness of the organic conversion layer 16 to the above-described sufficient thickness, the number of electron-hole pairs generated by a radiant ray other than the γ ray (e.g. β ray, α ray, neutron ray, etc.) can be increased. Thus, by setting the above-described sufficient thickness, the organic conversion layer 16 can be caused to have a configuration that can selectively convert energy of the radiant ray L other than the γ ray (e.g. β ray, α ray, neutron ray, etc.) into charges.

Next, the third electrode 20 will be described. The third electrode 20 is provided inside the organic conversion layer 16. The third electrode 20 is an electrode to which bias is applied.

The third electrode 20 is electrically connected to the voltage applying unit and the detection unit 24. The voltage applying unit 22 applies bias to the third electrode 20. The detection unit 24 detects an output signal output from the third electrode 20.

In other words, the third electrode 20 is an electrode to which bias is applied, and is an electrode used for the detection of an output signal.

In addition, a potential of the third electrode 20 is higher than potentials of the first electrode 12 and the second electrode 14. In other words, the potentials of the first electrode 12 and the second electrode 14 have a difference in potential with the third electrode 20. FIG. 1 illustrates a case where the first electrode 12 and the second electrode 14 are grounded. Thus, the potentials of the first electrode 12 and the second electrode 14 are lower than the potential of the third electrode 20.

In addition, the potentials of the first electrode 12 and the second electrode 14 are only required to have a difference in potential with the third electrode 20, and a configuration is not limited to a configuration in which both of the first electrode 12 and the second electrode 14 are grounded. In other words, at least one of the first electrode 12 and the second electrode 14 may be connected to the voltage applying unit 22 via a resistor so as to have a potential lower than the third electrode 20.

A position of the third electrode 20 in the thickness direction Z of the organic conversion layer 16 is not limited.

Nevertheless, the third electrode 20 is preferably disposed at the center in the thickness direction Z of the organic conversion layer 16. In other words, it is preferable that a first distance L1 between the first electrode 12 and the third electrode 20 is substantially the same as a second distance L2 between the second electrode 14 and the third electrode 20.

A position and a range of the third electrode 20 in the plane direction X of the organic conversion layer 16 are not limited. The third electrode 20 preferably has a sheet shape disposed throughout the entire region in the plane direction X in the organic conversion layer 16. In addition, the third electrode 20 may have a sheet shape that occupies a partial region in the plane direction X in the organic conversion layer 16. In addition, the third electrode 20 may have a configuration including a plurality of regions having the same position in the thickness direction Z of the organic conversion layer 16, and having different positions in the plane direction X.

The third electrode 20 preferably has one or a plurality of through-holes Q that penetrate in the thickness direction Z of the organic conversion layer 16.

When the third electrode 20 has the through-holes Q, energy of the γ ray can be prevented from being converted into charges in the organic conversion layer 16. Thus, the organic conversion layer 16 can selectively convert energy of another radiant ray L other than the γ ray (β ray, α ray, neutron ray, etc.) into charges. It is considered that this is because the γ ray contained in the radiant ray L that has entered the organic conversion layer 16 can be prevented from contacting the third electrode 20 to fail in being transmitted through the organic conversion layer 16, and from being converted into charges in the organic conversion layer 16.

In addition, similar effects can be obtained also in a case where at least one of the first electrode 12 and the second electrode 14 has the through-holes Q.

In addition, in a case where at least one of the first electrode 12, the second electrode 14, and the third electrode 20 has a plurality of through-holes Q, it is preferable that the plurality of through-holes Q are uniformly arrayed along the plane direction X in a mutually-equal size and at equal intervals. In other words, it is preferable that at least one of the first electrode 12, the second electrode 14, and the third electrode 20 is formed as a netlike sheet by the plurality of through-holes Q. In addition, the shape of the through-holes Q is not limited. For example, the shape of the through-holes Q may be any of a circular shape and a rectangular shape.

Constituent materials of the first electrode 12, the second electrode 14, and the third electrode 20 are only required to be materials having conductivity, and are not limited. For example, the first electrode 12 is Indium Tin Oxide (ITO), graphene, ZnO, aluminum, gold, or the like.

Nevertheless, the material of the second electrode 14 needs to have conductivity, and is material that lets through the radiant ray L entering the organic conversion layer 16.

In addition, it is preferable that at least one of the first electrode 12, the second electrode 14, and the third electrode 20 is formed from conductive carbon material. By forming at least one of the first electrode 12, the second electrode 14, and the third electrode 20 from conductive carbon material, the organic conversion layer 16 can be prevented from converting energy of the γ ray into charges.

For example, it is only required that at least one of the first electrode 12, the second electrode 14, and the third electrode 20 is formed from at least one type or more of carbon fiber, carbon paper, a porous carbon sheet, an active carbon sheet, and graphene.

Next, the voltage applying unit 22 will be described. The voltage applying unit 22 applies bias to the third electrode 20. In addition, the voltage applying unit 22 may apply bias to the third electrode 20 via an amplifier of the detection unit 24.

The detection unit 24 detects an output signal output from the third electrode 20. The output signal is a signal indicating a charge amount converted in the organic conversion layer 16. In other words, the output signal is detected energy of the radiant ray L that has been detected in the organic conversion layer 16. The detection unit 24 converts a charge amount of charges detected in the organic conversion layer 16, into a signal that can be measured by a charge amplifier or the like, and thereby makes the signal as an output signal. In addition, in the present embodiment, for the sake of simplifying the description, the description will be given assuming that the detection unit 24 receives an output signal from the first electrode 12.

Based on the output signal received from the third electrode 20, the detection unit 24 derives detected energy of the radiant ray L. A known method can be used for the derivation of the detected energy.

Manufacturing Method of Detector 30

Next, a manufacturing method of the detector 30 will be described. The manufacturing method of the detector 30 is not limited. For example, the detector 30 is manufactured in the following procedures.

First of all, the detection element 10 is manufactured. The first electrode 12 is stacked on the substrate 18, and an organic conversion layer 16A, the third electrode 20, an organic conversion layer 16B, and the second electrode 14 are stacked on the first electrode 12 in this order. In addition, each of the organic conversion layer 16A and the organic conversion layer 16B is a part of the organic conversion layer 16. The organic conversion layer 16A indicates a layer in the organic conversion layer 16 that is provided between the first electrode 12 and the third electrode 20. In addition, the organic conversion layer 16B indicates a layer in the organic conversion layer 16 that is provided between the third electrode 20 and the second electrode 14.

A known film formation method or a known manufacturing method can be used as a stacking method of the first electrode 12, the organic conversion layer 16 (the organic conversion layer 16A, the organic conversion layer 16B), the third electrode 20, and the second electrode 14.

Then, the first electrode 12 and the second electrode 14 are grounded. In addition, the third electrode 20 is electrically connected to the voltage applying unit 22 and the detection unit 24. Through these procedures, the detector 30 is manufactured.

Next, an operation of the detection element 10 will be described.

The radiant ray L enters the detection element 10 to reach the organic conversion layer 16. By the radiant ray L that has reached the organic conversion layer 16, an electron-hole pair including an electron and a hole is generated inside the organic conversion layer 16. More specifically, electron-hole pairs are generated in the organic conversion layer 16 at various positions in the thickness direction Z and the plane direction X of the organic conversion layer 16. Holes in the generated electron-hole pairs move to the first electrode 12 and the second electrode 14 side, and electrons e move to the third electrode 20 side.

Here, the detection element 10 of the present embodiment includes the third electrode 20 to which bias is applied that is provided inside the organic conversion layer 16. In addition, the organic conversion layer 16 is disposed between the first electrode 12 and the second electrode 14.

Thus, by the voltage applying unit 22 applying higher voltage to the third electrode 20, even in a case where a larger electrical field is formed by the organic conversion layer 16, differences in potential between the first electrode 12 and the second electrode 14 that are disposed on the outside of the organic conversion layer 16, and an outside earth E (specifically, ground surface, building, human, etc.) of the detection element 10 can be made smaller as compared with those in a case where the configuration of the present implementation is not employed. In other words, in the detection element 10 of the present embodiment, influence caused by a change in electromagnetic energy stored between the first electrode 12 and the second electrode 14, and the earth E can be prevented from being exerted on an output signal output from the third electrode 20.

Figure 2:
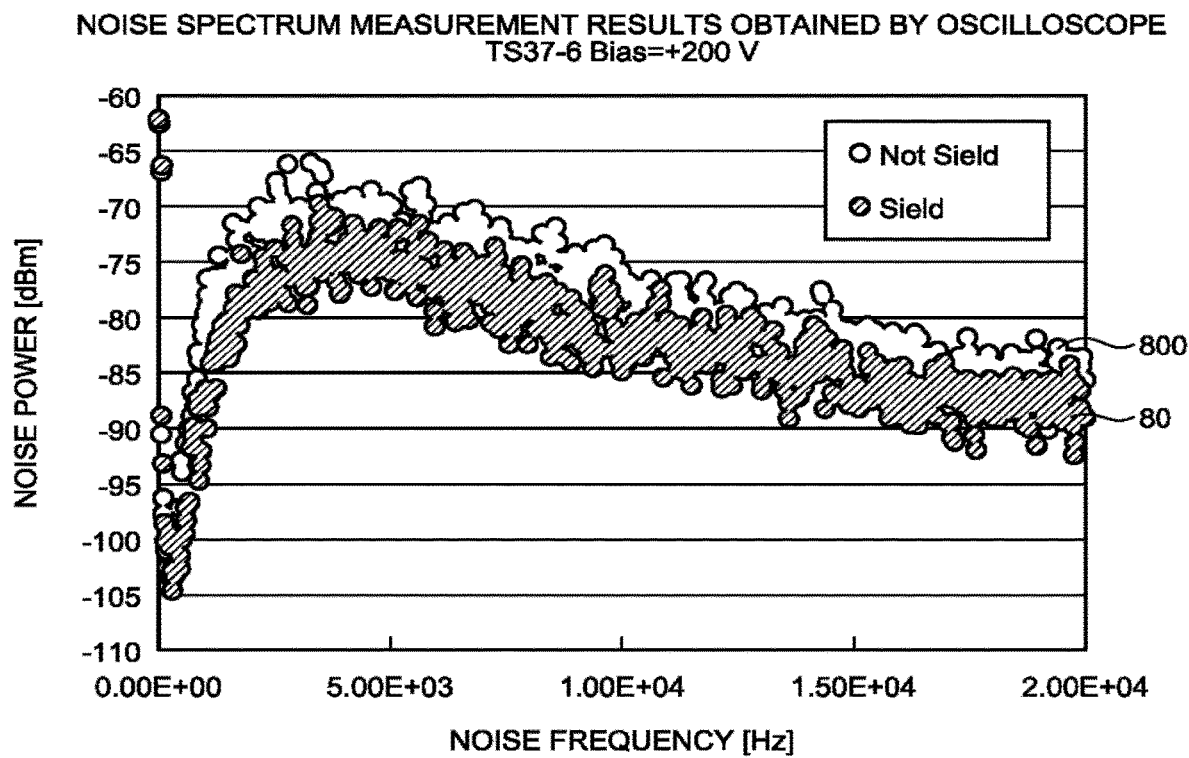
FIG. 2 is a diagram illustrating noise spectrum measurement results.

FIG. 2 is a diagram illustrating a noise spectrum measurement result 80 included in an output signal detected by the detection unit 24 of the detection element 10 of the present embodiment, and a noise spectrum measurement result 800 included in an output signal detected by a detection unit 24 of a comparative detection element.

Figure 3:
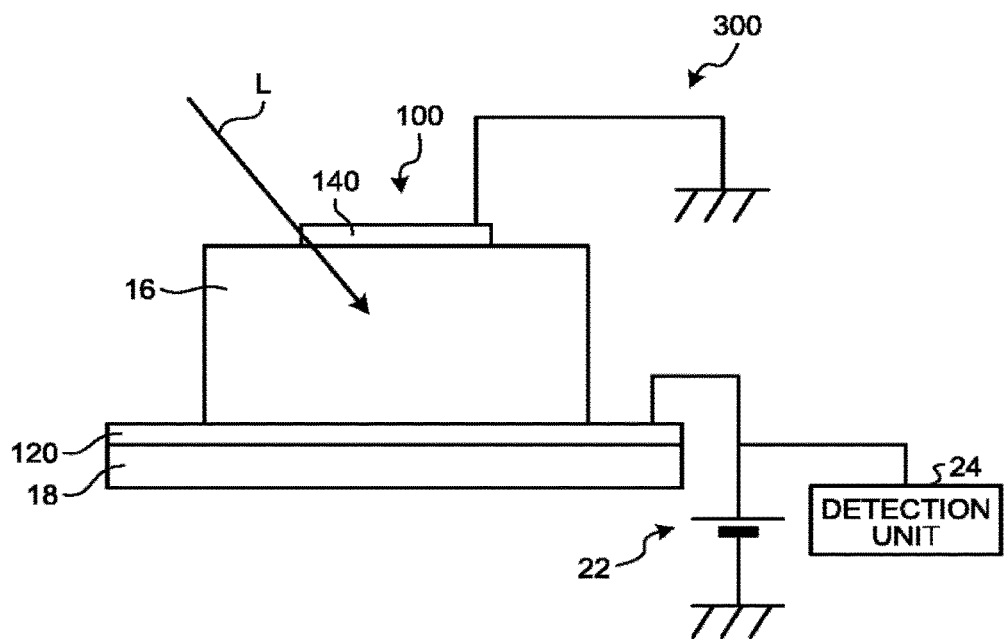
FIG. 3 is a schematic diagram of a comparative detector.

In addition, as the comparative detection element, a comparative detection element 100 included in a comparative detector 300 illustrated in FIG. 3 is used. FIG. 3 is a schematic diagram of the comparative detector 300. The comparative detector 300 is a conventional detector.

The comparative detector 300 includes the comparative detection element 100, a voltage applying unit 22, and the detection unit 24. The functions of the voltage applying unit 22 and the detection unit 24 are similar to those in the detector 30 of the present embodiment.

The comparative detection element 100 is a conventional detection element. The comparative detection element 100 includes a substrate 18, a first electrode 120, an organic conversion layer 16, and a second electrode 140. The organic conversion layer 16 is disposed between the first electrode 120 and the second electrode 140. In addition, an electrode is not provided inside the organic conversion layer 16 of the comparative detection element 100. The first electrode 120 is an electrode to which bias is applied. The first electrode 120 is connected to the voltage applying unit 22 and the detection unit 24. On the other hand, the second electrode 140 is grounded.

Referring back to FIG. 2, the description will be continued. Then, voltage of +200 V is applied to the third electrode 20 of the detection element 10, and the noise spectrum measurement result 80 included in an output signal output from the third electrode 20 was obtained. Similarly, voltage of +200 V is applied to the first electrode 120 of the comparative detection element 100, and the noise spectrum measurement result 800 included in an output signal output from the first electrode 120 was obtained.

As a result, as illustrated in FIG. 2, a reduction in noises contained in the noise spectrum measurement result 80 included in the output signal detected by the detection unit 24 of the detection element 10 of the present embodiment was achieved as compared with the noise spectrum measurement result 800 included in the output signal detected by the detection unit 24 of the comparative detection element 100.

As described above, the detection element 10 of the present embodiment includes the first electrode 12, the second electrode 14, the organic conversion layer 16, and the third electrode 20. The organic conversion layer 16 is disposed between the first electrode 12 and the second electrode 14, and converts energy of the radiant ray L into charges. The third electrode 20 is provided inside the organic conversion layer 16, and bias is applied thereto.

Thus, in the detection element 10 of the present embodiment, even in a case where high voltage is applied to the third electrode 20, and a larger electrical field is formed by the organic conversion layer 16, differences in potential between the first electrode 12 and the second electrode 14 that are disposed on the outside of the organic conversion layer 16, and the outside earth E of the detection element 10 can be made smaller as compared with those in a case where the configuration e present implementation is not employed. In other words, in the detection element 10 of the present embodiment, influence caused by a change in electromagnetic energy stored between the first electrode 12 and the second electrode 14, and the earth E can be prevented from being exerted on an output signal output from the third electrode 20. In other words, the detection element 10 of the present embodiment can prevent noises from being contained in an output signal output from the third electrode 20.

Thus, the detection element 10 of the present embodiment can suppress a decrease in detection sensitivity.

Modified Example 1

In addition, in the above-described embodiment, as an example, the description has been given of a configuration in which the third electrode 20 has a sheet shape disposed throughout the entire region in the plane direction X in the organic conversion layer 16.

Nevertheless, the third electrode 20 may have a configuration including a plurality of regions having the same position in the thickness direction Z of the organic conversion layer 16, and having different positions in the plane direction X.

Figure 4:
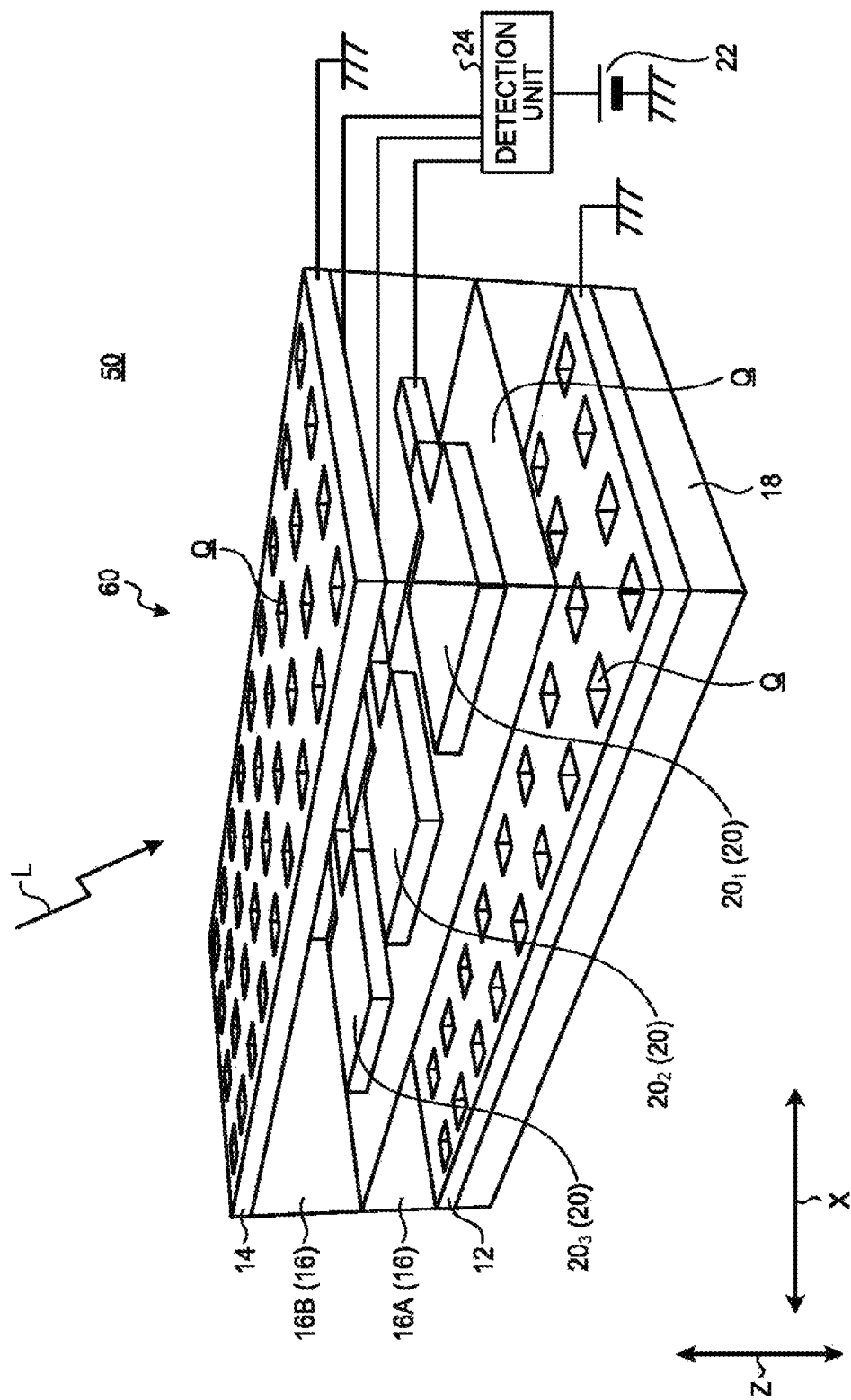
FIG. 4 is a schematic diagram illustrating an example of a detector.

FIG. 4 is a schematic diagram illustrating an example of a detector 50 in this modified example.

The detector 50 includes a detection element 60, a voltage applying unit 22, and a detection unit 24. The detection element 60, the voltage applying unit 22, and the detection unit 24 are electrically connected. In addition, as an example, FIG. 4 illustrates a configuration in which the voltage applying unit 22 applies voltage to the detection element 60 via the detection unit 24.

The detector 50 has a configuration similar to the detection element 10 of the above-described embodiment except that the detection element 60 is included in place of the detection element 10. The detection element 60 is similar to the detection element 10 of the above-described embodiment except that the arrangement of the third electrode 20 is different.

In this modified example, the third electrode 20 includes a plurality of regions $20_1$ to $20_3$ having the same position in the thickness direction Z of the organic conversion layer 16, and having different positions in the plane direction X.

In addition, the third electrode 20 may include two regions, or may include four or more regions.

In this manner, the third electrode 20 may include a plurality of regions having the same position in the thickness direction Z of the organic conversion layer 16, and having different positions in the plane direction X.

Modified Example 2

In addition, in the present embodiment, as an example, the description has been given of a case where the first electrode 12 and the second electrode 14 have a one-layer sheet shape. Nevertheless, at least one of the first electrode 12 and the second electrode 14 may include a plurality of electrode layers having different positions in the thickness direction of the organic conversion layer 16.

In this case, it is preferable that the plurality of electrode layers included in at least one of the first electrode 12 and the second electrode 14 have larger differences in potential as getting away from the third electrode 20.

Second Embodiment

In the present embodiment, the description will be given of a configuration in which the detection element 10 of the above-described embodiment further includes a fourth electrode.

Figure 5:
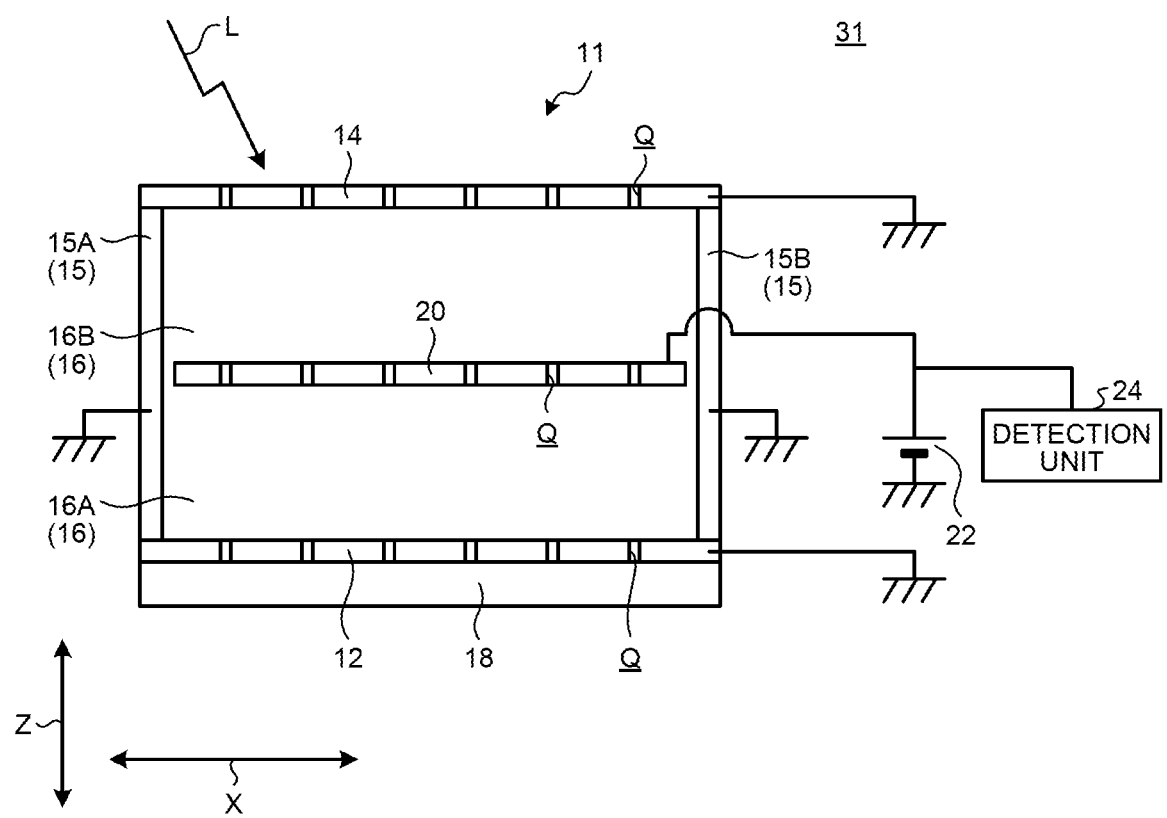
FIG. 5 is a schematic diagram illustrating an example of a detector.

FIG. 5 is a schematic diagram illustrating an example of a detector 31 of the present embodiment.

The detector 31 includes a detection element 11, a voltage applying unit 22, and a detection unit 24. The detection element 11, the voltage applying unit 22, and the detection unit 24 are electrically connected. The voltage applying unit 22 and the detection unit 24 are similar to those in the detector 30 of the first embodiment.

The detection element 11 includes a substrate 18, a first electrode 12, a second electrode 14, an organic conversion layer 16, a third electrode 20, and a fourth electrode 15. The substrate 18, the first electrode 12, the second electrode 14, the organic conversion layer 16, and the substrate 18 are similar to those in the detection element 10 of the first embodiment.

The fourth electrode 15 is disposed on at least one end portion side of the organic conversion layer 16 in a direction (the plane direction X) intersecting with a facing direction (the thickness direction Z) of the first electrode 12 and the second electrode 14. In addition, a potential of the fourth electrode 15 is lower than the third electrode 20.

In the present embodiment, a configuration in which fourth electrodes 15 (a fourth electrode 15A, a fourth electrode 15B) are respectively disposed at one end portion and another end portion in the plane direction X in the organic conversion layer 16 is illustrated as an example. In addition, in other words, in the present embodiment, the fourth electrodes 15 include the fourth electrode 15A and the fourth electrode 15B. In addition, in a case where the fourth electrode 15A and the fourth electrode 15B are described with being collectively referred to, they will be described with being simply referred to as the fourth electrodes 15.

The fourth electrodes 15 are preferably extended in the facing direction of the first electrode 12 and the second electrode 14 (i.e. the thickness direction Z of the organic conversion layer 16). In addition, it is preferable that an end portion of the fourth electrode in this facing direction (the thickness direction Z) is connected to at least one of the first electrode 12 and the second electrode 14.

As an example, FIG. 5 illustrates a configuration in which one end portions of both the fourth electrode 15A and the fourth electrode 15B in an extending direction (arrow Z direction) of these fourth electrodes 15 are connected to the second electrode 14, and other end portions thereof are connected to the first electrode 12.

Thus, in the present embodiment, the third electrode 20 is disposed inside the organic conversion layer 16 so that at least part of the outer periphery is surrounded by the first electrode 12, the second electrode 14, and the fourth electrodes 15.

In addition, the fourth electrodes 15 are only required to have potentials lower than the third electrode 20. It is preferable that the fourth electrodes 15 have potentials lower than the third electrode 20, and have the same potential as the first electrode 12 and the second electrode 14. In addition, it is particularly preferable that the fourth electrodes 15 are grounded.

As described above, in the present embodiment, the detection element 11 further includes the fourth electrode 15 in addition to the configurations of the detection element 10 that have been described in the first embodiment. The fourth electrode 15 is an electrode disposed on at least one end portion side of the organic conversion layer 16 in the direction (the plane direction X) intersecting with the facing direction (the thickness direction Z) of the first electrode 12 and the second electrode 14, and having a potential lower than the third electrode 20.

Thus, in the present embodiment, the third electrode 20 disposed inside the organic conversion layer 16 of the detection element 11 has a configuration of being disposed with being surrounded by electrodes having lower potentials than the third electrode 20.

Thus, the detection element 11 of the present embodiment can further suppress decrease in detection sensitivity as compared with the detection element 10 of the first embodiment.

In addition, in the above-described embodiments, the description has been given of a case where positive bias is applied to the third electrode 20. Similar effects can be similarly obtained also in a case where negative bias is applied to the third electrode 20, and other electrodes have potentials higher than the third electrode 20.

In addition, an applicable scope of the detection element 10, the detection element 11, and the detection element 60 that have been described in the above-described embodiments are not limited. For example, the detection element 10, the detection element 11, and the detection element 60 can be applied to various devices that detect the radiant ray L. Specifically, the detection element 10, the detection element 11, and the detection element 60 can be applied to a survey meter or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection element comprising:
   a first electrode;
   a second electrode;
   an organic conversion layer which is stacked between the first electrode and the second electrode, and is configured to convert energy of a radiant ray into a charge; and
   a third electrode which is provided inside the organic conversion layer, and to which bias is applied, wherein
   both of the first electrode and the second electrode are grounded, and
   a thickness of the organic conversion layer is 50 μm or more.

2. The element according to claim 1, wherein potentials of the first electrode and the second electrode have a difference in potential with the third electrode.

3. The element according to claim 1, wherein at least one of the first electrode, the second electrode, and the third electrode has a through-hole penetrating in a thickness direction of the organic conversion layer.

4. The element according to claim 1, wherein at least one of the first electrode, the second electrode, and the third electrode is formed from conductive carbon material.

5. The element according to claim 1, further comprising a fourth electrode disposed on at least one end portion side of the organic conversion layer in a direction intersecting with a facing direction of the first electrode and the second electrode, and having a potential lower than the third electrode.

6. The element according to claim 5, wherein the fourth electrode is extended in the facing direction, and an end portion thereof in the facing direction is connected to at least one of the first electrode and the second electrode.

7. The element according to claim 1, wherein the radiant ray is a β ray.

8. A detector comprising:
   the detection element according to claim 1;
   a voltage applying unit configured to apply bias to the third electrode; and
   a detection unit configured to detect an output signal output from the third electrode.

9. The element according to claim 1, further comprising:
   two fourth electrodes, each of the fourth electrodes having a potential lower than the third electrode, one of the fourth electrodes being disposed on one end portion side of the organic conversion layer in a direction intersecting with a facing direction of the first electrode and the second electrode, the other of the fourth electrodes being disposed on the other end portion side of the organic conversion layer in the direction, one end portion of each of the fourth electrodes in the facing direction being connected to the first electrode, the other end portion of each of the fourth electrodes in the facing direction being connected to the second electrode.

10. The element according to claim 9, wherein the fourth electrodes are grounded.

11. The element according to claim 1, wherein
    organic material used in the organic conversion layer includes at least one type of polyphenylene vinylene (PPV) derivative and polythiophene high-polymer material.

12. The element according to claim 1, wherein
    the thickness of the organic conversion layer is equal to or larger than a thousandfold of a thickness of the first electrode or the second electrode.

13. The element according to claim 1, wherein
    the organic conversion layer includes inorganic material.

14. The element according to claim 13, wherein
    the inorganic material includes fullerene, fullerene derivative, a carbon nanotube (CNT) having semiconductivity, and a CNT compound.

15. The element according to claim 1, wherein
    the radiant ray enters from an incidence surface of the organic conversion layer, and
    the incidence surface extends along a direction orthogonal to a thickness direction of the organic conversion layer.

16. The element according to claim 1, wherein
    an output signal output from the third electrode is detected by a detection unit.

17. A detection element comprising:
    a first electrode;
    a second electrode;
    an organic conversion layer which is provided between the first electrode and the second electrode, and is configured to convert energy of a radiant ray into a charge; and
    a third electrode which is provided inside the organic conversion layer, and to which bias is applied; wherein
    the first electrode and the second electrode are disposed so as to sandwich the organic conversion layer in a thickness direction of the organic conversion layer,
    at least one of the first electrode and the second electrode includes a plurality of electrode layers having different positions in the thickness direction, and
    the plurality of electrode layers have larger differences in potential as getting away from the third electrode.

* * * * *